United States Patent
Su et al.

(10) Patent No.: US 6,545,391 B1
(45) Date of Patent: *Apr. 8, 2003

(54) POLYMER-POLYMER BILAYER ACTUATOR

(75) Inventors: Ji Su, Highland Park, NJ (US);
Joycelyn S. Harrison, Hampton, VA (US); Terry L. St. Clair, Poquoson, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/696,524

(22) Filed: Oct. 23, 2000

Related U.S. Application Data

(60) Provisional application No. 60/161,112, filed on Oct. 22, 1999.

(51) Int. Cl.[7] ............................................. H01L 41/09
(52) U.S. Cl. ..................... 310/332; 310/800; 310/331
(58) Field of Search ................................ 310/330, 331, 310/332, 800

(56) References Cited

U.S. PATENT DOCUMENTS

| | | | |
|---|---|---|---|
| 3,781,955 A | * 1/1974 | Lavrinenko et al. | 29/25.35 |
| 4,330,730 A | 5/1982 | Kurz et al. | |
| 4,342,936 A | * 8/1982 | Marcus et al. | 29/25.35 |
| 4,400,634 A | 8/1983 | Micheron | |
| 4,435,667 A | * 3/1984 | Kolm et al. | 310/330 |
| 4,491,760 A | 1/1985 | Linvill | |
| 4,649,312 A | * 3/1987 | Robin et al. | 310/319 |
| 4,786,837 A | * 11/1988 | Kalnin et al. | 310/330 |
| 4,868,447 A | * 9/1989 | Lee et al. | 310/316.01 |
| 4,879,698 A | 11/1989 | Langberg | |
| 5,034,648 A | * 7/1991 | Gastgeb | 310/319 |
| 5,153,859 A | * 10/1992 | Chatigny et al. | 264/204 |

(List continued on next page.)

FOREIGN PATENT DOCUMENTS

WO   WO 01/31172 A2 * 5/2001

OTHER PUBLICATIONS

Pelrine et al. "Electrostriction of Polymer Films for Microactuators." Jan. 1997, 10th Ann. Int. Workshop on Micro Electro Mechanical Systems, 238–243.*

Su et al. "Electrostrictive Graft Elastomers and Applications." Jun. 2000, Mat. Res. Symp. Proc. vol. 600, 131–161.*

Su et al. "Novel Polymeric Elastomers for Actuation." May 2002, 2000 12th Int. Symp. on App. Ferro. vol. 2, 811–814.*

Su et al. abstract for talk "Electrostrictive Graft Elastomers and Applications." Nov. 1999, Materials Research Society Symposium on Electroactive Polymers, 573.*

Pelrine et al. "Electrostriction of polymer dielectrics with compliant electrodes as means of actuation." Jul. 1998, Sensors and Actuators A vol. 64, 77–85.*

*Primary Examiner*—Karl Tamai
*Assistant Examiner*—Jaydi Aguirrechea
(74) *Attorney, Agent, or Firm*—Robin W. Edwards

(57) ABSTRACT

A device for providing an electromechanical response includes two polymeric webs bonded to each other along their lengths. At least one polymeric web is activated upon application thereto of an electric field and exhibits electrostriction by rotation of polar graft moieties within the polymeric web. In one embodiment, one of the two polymeric webs in an active web upon application thereto of the electric field, and the other polymeric web is a non-active web upon application thereto of the electric field. In another embodiment, both of the two polymeric webs are capable of being active webs upon application thereto of the electric field. However, these two polymeric webs are alternately activated and non-activated by the electric field.

21 Claims, 2 Drawing Sheets

U.S. PATENT DOCUMENTS

| | | |
|---|---|---|
| 5,245,734 A | 9/1993 | Issartel |
| 5,440,194 A | 8/1995 | Beurrier |
| 5,517,467 A * | 5/1996 | Fromont et al. ............ 310/337 |
| 5,608,692 A | 3/1997 | Toda |
| 5,720,169 A | 2/1998 | Schneider |
| 5,736,590 A | 4/1998 | Rasmussen |
| 5,761,782 A | 6/1998 | Sager |
| 5,762,830 A | 6/1998 | Long et al. |
| 5,766,013 A | 6/1998 | Vuyk |
| 5,977,685 A * | 11/1999 | Kurita et al. ................ 310/311 |
| 6,208,065 B1 * | 3/2001 | Ueyama ...................... 310/311 |
| 6,297,579 B1 * | 10/2001 | Martin et al. ................ 310/330 |
| 6,385,354 B1 * | 5/2002 | Digonnet et al. .............. 385/3 |
| 6,404,108 B1 * | 6/2002 | Yachi et al. ................ 310/330 |

* cited by examiner

POLYMER-POLYMER BILAYER ACTUATOR

CLAIM OF BENEFIT OF PROVISIONAL APPLICATION

Pursuant to 35 U.S.C. §119, the benefit of priority from provisional application No. 60/161,112, with a filing date of Oct. 22, 1999, is claimed for this non-provisional application.

CROSS REFERENCE TO RELATED CASES

This application is related commonly owned patent application Ser. No. 09/696,528, filed Oct. 23, 2000, entitled "Electrostrictive Graft Elastomers."

ORIGIN OF THE INVENTION

This invention was jointly made by employees of the U.S. Government and an employee of the National Research Council and may be manufactured and used by or for the government for governmental purposes without the payment of royalties thereon or therefor.

BACKGROUND OF THE INVENTION

1. Field of the Invention

This invention relates generally to actuators. It relates in particular to a device for providing an electromechanical response which has two polymeric webs bonded to each other along their lengths.

2. Description of the Related Art

Electromechanical actuators of the related art include ceramic actuators of various configurations, including those which are direct piezoelectric; polymer actuators, including direct piezoelectric, electrostatic, conductive polymer based, gel based, and ionomeric; and actuators of ceramic-polymer composites, including those which are direct piezoelectric. All of these actuators are found wanting, and, as a result their applicability is limited. For example, the ceramic actuators are generally heavy and brittle and they provide a small displacement/strain. Polymer actuators generally also provide either a small displacement/strain (e.g., PVDF), they are subject to environmental limitations (e.g., ionomer), or they have low output force due to low mechanical modulus (e.g., polyurethane, silocone elastomer). For example, ionomeric polymers generally require a humid environment for operation. Ceramic-polymer composite actuators also exhibit a small displacement/strain, and they are generally heavy and brittle. Examples of polymer-polymer bi-layer configurations of the related art are found in U.S. Pat. No. 4,400,634 and U.S. Pat No. 4,330,730, the former being based on Maxwell Stress (i.e., electrostatics), and the latter being based on the piezoelectric effect. Neither of these patents discloses or suggests employing a layer which exhibits electrostriction, viz., by rotation of polar graft moieties within the layer, nor is there any comprehension or suggestion therein of the advantageous results achieved by providing at least one layer which exhibits electrostriction.

SUMMARY OF THE INVENTION

It is the primary object of the present invention to obviate the inadequacies of related art devices and provide an actuator which has a low mass and a unified body, is simple to operate, has a long life, is tough, and is easily adjustable and completely functional in all environments.

This object, and other attending benefits, was achieved by the provision of a device which includes two polymeric webs bonded to each other along their lengths. At least one polymeric web is activated upon application thereto of an electric field and exhibits electrostriction by rotation of polar graft moieties within the polymeric web.

In one preferred embodiment, one of the two polymeric webs is an active web upon application thereto of the electric field, and the other polymeric web is a non-active web upon application thereto of the electric field. In this embodiment the active web is composed of an electrostrictive graft elastomer and the non-active web is composed of any other flexible polymer. Such an electrostrictive graft elastomer is described and claimed in "Electrostrictive Graft Elastomers", Ser. No. 09/696,528, filed Oct. 23, 2000, hereby incorporated by reference. The electrostrictive graft elastomer has a backbone molecule which is a non-crystallizable, flexible macromolecular chain, preferably a member selected from the group consisting of silicones, polyurethanes, polysulfides, nitrile rubbers, polybutenes, and fluorinated elastomers, e.g., a chlorotrifluoroethylene-vinylidene fluoride copolymer. The electrostrictive graft elastomer contains a grafted polymer which is a homopolymer or a copolymer which forms polar crystal phases and physical entanglement sites with backbone molecules, preferably a member selected from the group consisting of poly(vinylidene fluoride), poly(vinylidene fluoride-trifluoroethylene) copolymers, poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolomeers, poly(cyanoaryl ether)), polyureas, polythioureas, ferroelectric liquid crystal polymers and piezoelectric bipolymers. In this embodiment the non-active web is composed of any other flexible polymer, preferably a member selected from the group consisting of silicones, polyurethanes, polysulfides, nitrile rubbers, polybutenes, and fluorinated thermoplastic elastomers, e.g., a chlorotrifluoroethylene-vinylidene fluoride copolymer.

In another preferred embodiment, both of the two polymeric webs are capable of being active webs upon application thereto of the electric field, the two polymeric webs being alternately activated and non-activated by the electric field. In this embodiment, both of the polymeric webs are composed of an electrostrictive graft elastomer having a backbone molecule which is a non-crystallizable, flexible macromolecular chain, preferably a member selected from the group consisting of silicones, polyurethanes, polysulfides, nitrile rubbers, polybutenes, and fluorinated elastomers, such as a chlorotrifluoroethylene-vinylidene fluoride copolymer. The electrostrictive graft elastomer contains a grafted polymer which is a homopolymer or a copolymer which forms polar crystal phases and physical entanglement sites with backbone molecules, preferably a member selected from the group consisting of poly (vinylidene fluoride), poly(vinylidene fluoride-trifluoroethylene) copolymers, poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolomeers, poly(cyanoaryl ether)), polyureas, polythioureas, ferroelectric liquid crystal polymers and piezoelectric bipolymers.

In both preferred embodiments, the two polymeric webs are bonded to each other by bonding means selected from the group consisting of chemical bonding, physical bonding, mechanical bonding, and biological bonding. Preferred is a chemical bonding means employing a chemical adhesive, which is cast and cured at ambient temperature to form an integrating layer of less than 1 micrometer thickness positioned between the two polymeric webs.

The resulting actuator achieves the primary object set forth above. Moreover, it provides a large displacement, high energy density, and a double frequency response as a result of a quadratic relationship of strain with applied electric field. Such a double frequency response is not evident in ionomer, piezoelectric or conducting polymer actuators. Furthermore, the actuator of the present invention does not require the humid environment which is necessary for ionomer actuators. Applications for electromechanical actuators according to the present invention include: motion control, position control, tension control, curvature control, biomedical pulse control, surface flow dynamic control, display panels, optical alignment, optical filters, microelectromechanical systems, and nano-electromechanical systems.

BRIEF DESCRIPTION OF THE DRAWINGS

For a more complete understanding of the present invention, including its primary object and attending benefits, reference should be made to the Detailed Description of the Invention, which is set forth below. This Detailed Description should be read with reference to the accompanying Drawings, wherein.

DETAILED DESCRIPTION OF THE INVENTION

Figure 1:
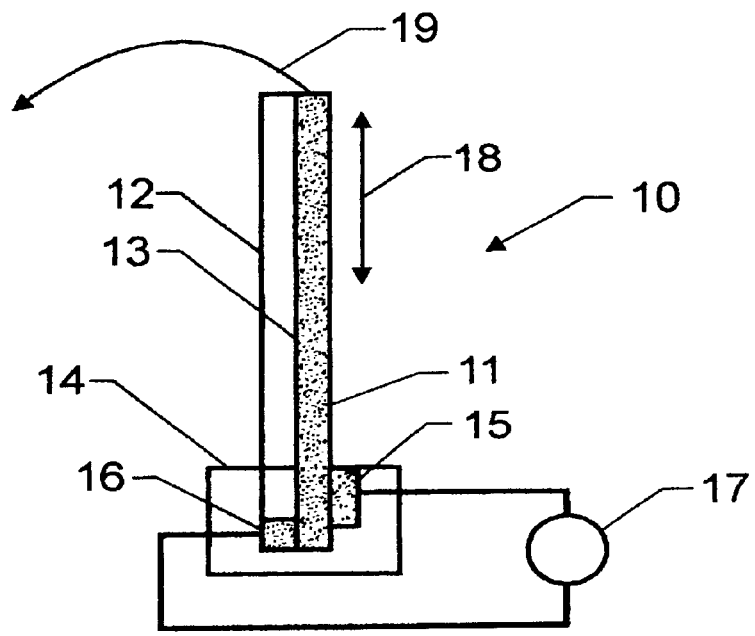
FIG. 1 is a schematic showing the configuration of an embodiment of the present invention under working conditions.
Figure 2:
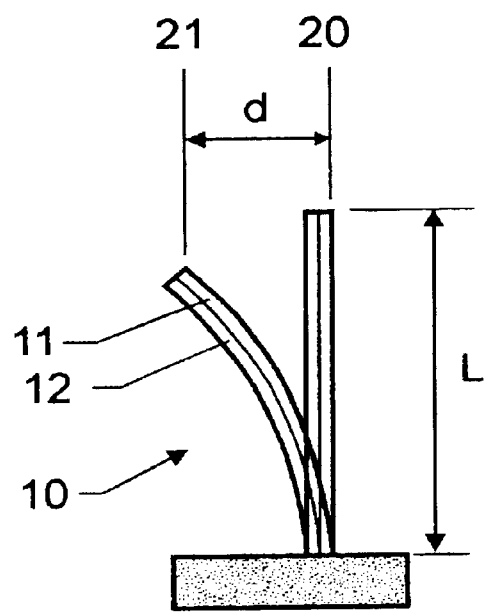
FIG. 2 is a schematic illustrating the quantity tip displacement employing the embodiment of FIG. 1.
Figure 3:
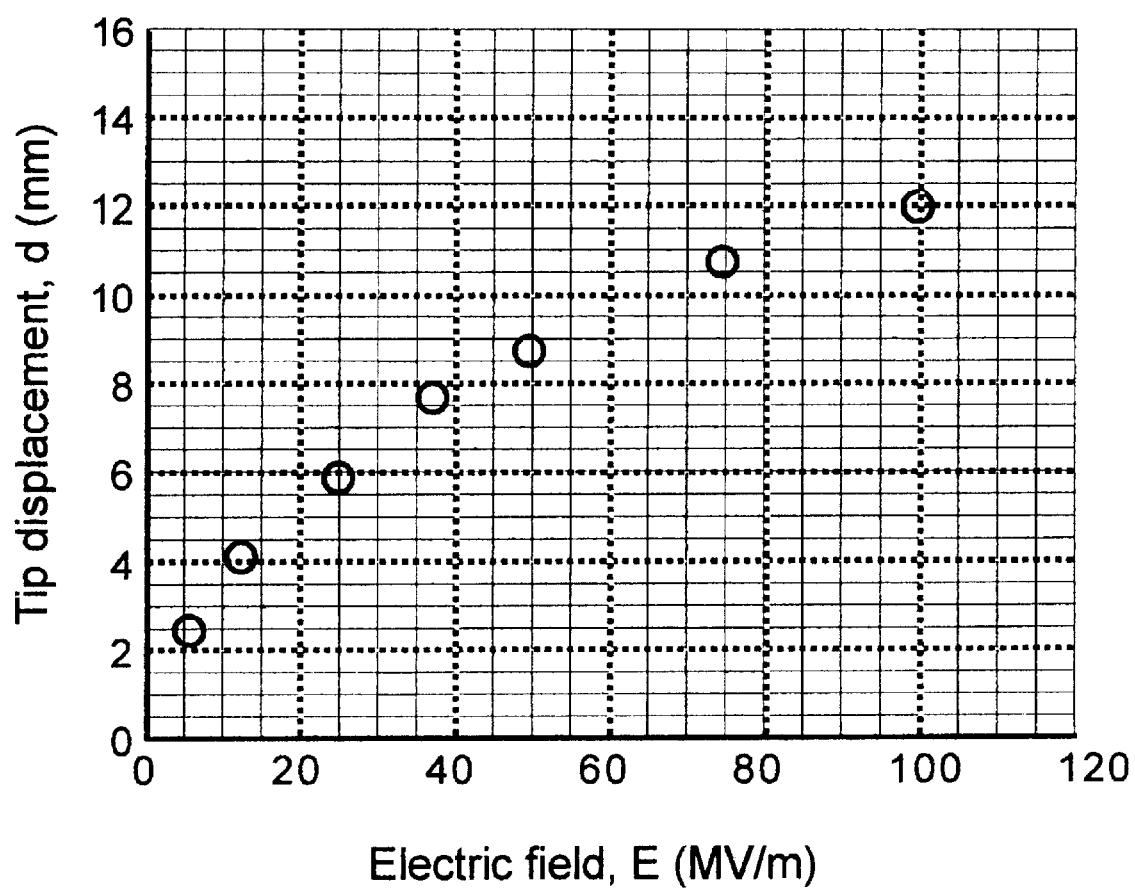
FIG. 3 is a graph depicting the dependence of the tip displacement illustrated in FIG. 2 upon applied electric field.

Referring now to the drawings, FIG. 1 shows as an embodiment of the present invention a device 10 which has 2 elements, viz., an electrically active constituent 11 and an electrically non-active constituent 12, which are bound together along their lengths by bonding means 13, e.g. a chemical bonding means such as a thin layer of an epoxy resin. Mechanical holder 14 holds the device 10 in place, and electrodes 15 and 16 provide contact between opposing surfaces of electrically active constituent 11 and a source of alternating voltage 17. As an example, electrically active constituent 11 is a film of an electrostrictive fluorinated elastomer (Cefral-soft), electrodes 15 and 16 are gold electrodes, and electrically non-active constituent 12 is a film of the same fluorinated elastomer (Cefral-soft), but without any attaching electrodes. Bonding means 13 is a thin layer of epoxy resin, and the thickness ratio of constituent 11: constituent 12 is 1:1 (18 micrometers: 18 micrometers). When an electric field is applied to electrically active constituent 11, the electrostrictive fluorinated elastomer expands in the lateral direction, as shown by arrows 18, while electrically non-active constituent 12 maintains a constant length. Since constituents 11 and 12 are securely bonded to each other, a bending in the direction of electrically non-active constituent 12 will occur, as shown by arrow 19. Such a bending results in a tip displacement d as shown in FIG. 2, as the actuator 10 bends from its original position 20 before application of the electric field to new position 21 after application of the electric field. In this example the active length L of the actuator 10 according to the present invention is 17 mm. The bending direction 19 does not change with the change in polarity of the applied voltage, because the strain response in the lateral direction of the electrostrictive fluorinated elastomer film is always positive, independent of the polarity of the applied voltage. FIG. 3 is a plot of experimental results showing the dependence of tip displacement d on the applied electric field E for the embodiment shown in FIGS. 1 and 2 and discussed above.

The designation electrostrictive is employed herein when the dimension of a material changes quadratically to an applied electrical voltage as a result of alignment of polar domain phase following the applied electric field. The device for providing an electromechanical response, or actuator, according to the present invention comprises two layers or webs. A web is understood by the skilled artisan to be a sheet, strip, film, plate, or the like, which may have various configurations such as planar, annular, and spiral. Furthermore, a web may have multiple bonded layers, with the bond material having elastomeric properties comparable to the materials being bonded. The present actuator comprises two webs. The two webs can alternatively act as an active web and a non-active web (CASE I), or one web is designated as the active web and the other web is designated as a non-active web (CASE II). For CASE I, both webs are surface-electroded electrostrictive graft elastomers and the electric voltage is applied to them in an alternating way. For the CASE II, only the designated active web is a surface-electroded electrostrictive graft elastomer, and the non-active web is any appropriate material.

Factors which affect the performance of the present polymer-polymer bi-layer actuators include: 1) electromechanical properties of the active present web, such as electric field induced strain, mechanical modulus, and electromechanical conversion efficiency, as well as output energy/ energy density; 2) mechanical properties of the non-active web, such as mechanical modulus; 3) integrated interface between the active web and non-active web, as well as 4) the geometric dimension of each component. For an optimized configuration: 1) The active electrostrictive web offers maximized electric field induced strain and maximized mechanical modulus, therefore, maximized electromechanical output power/energy. 2) The non-active web offers mechanical modulus not higher than that of the active web. 3) The integrated interface between the active web and the non-active web offers strength and does not allow any significant sliding effect between the active and the non-active webs in the direction parallel to the surfaces. The integrated interface also offers maximized durability under working conditions. 4) The relative dimensions of the active web and the non-active web are chosen according to the requirements of the particular application. A relatively thin non-active web is preferred. 5) The thickness of the integrated interface is minimized as preferred.

The materials for the active web are electrostrictive graft elastomers than can offer electric field induced strain and high mechanical modulus. The backbone molecules in the electrostrictive graft elastomers are non-crystallizable flexible macromolecular chains that are homopolymers and copolymers containing two or more monomers. Typical elastomers are silicone, polyurethane, polysulfide, nitrile rubber, and polybutene, as well as fluorinated thermoplastic elastomers. The preferred embodiment is chlorotrifluoroethylene (CTFE)—vinylidene fluoride (VDF) copolymer (CTFE-VDF). The grafted molecules in the electrostrictive elastomers are homopolymers or copolymers that form polar crystal phases and cross link sites between the flexible backbone chains. The preferred ones offer large dipole moment in graft crystal phase, and a large difference in the crystal dimension between the directions perpendicular and parallel to the polarization. The grafted polymers of the preferred embodiments are poly(vinylidene fluoride) (PVDF), poly(vinylidene fluoride-trifluoroethylene) copolymers, poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly (vinylidene cyanide, vinylidene cyanide-based copolomeers, poly(cyanoaryl ether)), polyureas, polythioureas, ferroelectric liquid crystal polymers and piezoelectric bipolymers.

The materials for non-active web are polymeric materials that can be integrated to the active web. Preferred are those which offer the desired mechanical modulus. This means that the mechanical modulus of the non-active web is expected to be equal to or lower than the mechanical modulus of the active web. Typical polymers for the non-active web are silicone, polyurethane, polysulfide, nitrile rubber, and polybutene, as well as fluorinated thermoplastic elastomers such as graft elastomers. The preferred embodiment of the non-active web is the same graft polymeric elastomer as the active web.

Integration between the active web and the non-active web provides strong bonding and good durability under working conditions. The mechanisms for providing the integrating interface are chemical, physical, and mechanical as well as biological means. The preferred means provide ease in processing, minimized thickness, as well as the desired stiffness and durability. Especially preferred is a chemical adhesive, which is cast and cured at room temperature and provides a very thin integrating layer (less than 1 micrometer).

What is claimed is:

1. A device for providing an electromechanical response, which device comprises two polymeric webs bonded to each other along their lengths, at least one polymeric web is activated upon application thereto of an electric field and exhibits electrostriction by rotation of polar graft moieties within the polymeric web.

2. The device of claim 1, wherein one of the polymeric webs is an active web upon application thereto of the electric field, and the other polymeric web is a non-active web upon application thereto of the electric field.

3. The device of claim 2, wherein the active web comprises an electrostrictive graft elastomer and the non-active web comprises any other flexible polymer.

4. The device of claim 3, wherein the electrostrictive graft elastomer has a backbone molecule which is a non-crystallizable, flexible marcomolecular chain.

5. The device of claim 4, wherein the backbone molecule of the electrostrictive graft elastomer is a member selected from the group consisting of silicones, polyurethanes, polysulfides, nitrile rubbers, polybutenes, and fluorinated elastomers.

6. The device of claim 5, wherein the backbone molecule of the electrostrictive graft elastomer is a chlorotrifluoroethylene-vinylidene fluoride copolymer.

7. The device of claim 4, wherein the electrostrictive graft elastomer contains a grafted polymer which is a homopolymer or a copolymer which forms polar crystal phases and physical entanglement sites with backbone molecules.

8. The device of claim 7, wherein the grafted polymer is a member selected from a group consisting of poly (vinylidene fluoride), poly(vinylidene fluoride-trifluoroethylene) copolymers, poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolomeers, poly(cyanoaryl ether)), polyureas, polythioureas, ferroelectric liquid crystal polymers and piezoelectric bipolymers.

9. The device of claim 3, wherein the non-active web comprises a flexible polymer selected from the group consisting of silicones, polyurethanes, polysulfides, nitrile rubbers, polybutenes, and fluorinated thermoplastic elastomers.

10. The device of claim 9, wherein the non-active web comprises a cholotrifluoroethylene-vinylidene fluoride copolymer.

11. The device of claim 1, wherein both of the two polymeric webs are capable of being active webs upon application thereto of the electric field, the two polymeric webs being alternately activated and non-activated by the electric field.

12. The device of claim 11, wherein both of the polymeric webs comprise an electrostrictive graft elastomer.

13. The device of claim 12, wherein the electrostrictive graft elastomer has a backbone molecule which is a non-crystallizable, flexible macromolecular chain.

14. The device of claim 13, wherein the backbone molecule of the electrostrictive graft elastomer is a member selected from the group consisting of silicones, polyurethanes, polysulfides, nitrile rubbers, polybutenes, and fluorinated elastomers.

15. The device of claim 14, wherein the backbone molecule of the electrostrictive graft elastomer is a chlorotrifluoroethylene-vinylidene fluoride copolymer.

16. The device of claim 13, wherein the electrostrictive graft elastomer contains a grafted polymer which is a homopolymer or a copolymer which forms crystal phases and physical entanglement sites with backbone molecules.

17. The device of claim 16, wherein the grafting polymer is a member selected from the group consisting of poly (vinylidene fluoride), poly(vinylidene fluoride-trifluoroethylene) copolymers, poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolomeers, poly(cyanoaryl ether)), polyureas, polythioureas, ferroelectric liquid crystal polymers and piezoelectric bipolymers.

18. The device of claim 1, wherein the two polymeric webs are bonded to each other by bonding means selected from the group consisting of chemical bonding, physical bonding, mechanical bonding, and biological bonding.

19. The device of claim 18, wherein the bonding means is a chemical bonding means employing a chemical adhesive.

20. The device of claim 19, wherein the chemical adhesive is cast and cured at ambient temperature to form an integrating layer of less than 1 micrometer thickness which is positioned between the two polymeric webs.

21. The device of claim 1, wherein each polymeric web comprises a plurality of layers bonded to one another, wherein the bond material has elastomeric properties comparable to the materials being bonded.

* * * * *